US008668868B2

(12) United States Patent
Chiu et al.

(10) Patent No.: US 8,668,868 B2
(45) Date of Patent: Mar. 11, 2014

(54) METHODS AND APPARATUS FOR SMART ABATEMENT USING AN IMPROVED FUEL CIRCUIT

(75) Inventors: Ho-Man Rodney Chiu, San Jose, CA (US); Daniel O. Clark, Pleasanton, CA (US); Shaun W. Crawford, San Ramon, CA (US); Jay J. Jung, Sunnyvale, CA (US); Youssef A. Loldj, Sunnyvale, CA (US); Robbert M. Vermeulen, Pleasant Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 12/258,395

(22) Filed: Oct. 25, 2008

(65) Prior Publication Data

US 2009/0110622 A1  Apr. 30, 2009

Related U.S. Application Data

(60) Provisional application No. 60/983,143, filed on Oct. 26, 2007, provisional application No. 61/020,925, filed on Jan. 14, 2008.

(51) Int. Cl.
*G01N 21/00* (2006.01)
*B01D 47/00* (2006.01)
*B01D 47/06* (2006.01)
*B01D 53/02* (2006.01)

(52) U.S. Cl.
USPC .............. 422/62; 210/600; 210/85; 210/96.1; 210/97; 423/210; 423/241; 96/102

(58) Field of Classification Search
USPC .............. 210/600, 85, 96.1, 97; 423/210, 241
See application file for complete search history.

(56) References Cited

U.S. PATENT DOCUMENTS

| | | | |
|---|---|---|---|
| 3,299,416 A | 1/1967 | Koppel | |
| 3,918,915 A | 11/1975 | Holler, Jr. | |
| 4,280,184 A | 7/1981 | Weiner et al. | |
| 4,701,187 A | 10/1987 | Choe et al. | |
| 4,720,807 A | 1/1988 | Ferran et al. | |
| 4,820,319 A | 4/1989 | Griffis | |
| 5,001,420 A | 3/1991 | Germer et al. | |
| 5,004,483 A | 4/1991 | Eller et al. | |
| 5,118,286 A | 6/1992 | Sarin | |

(Continued)

FOREIGN PATENT DOCUMENTS

| | | |
|---|---|---|
| EP | 0916388 A2 | 5/1999 |
| JP | 03-090172 | 4/1991 |

(Continued)

OTHER PUBLICATIONS

U.S. Office Action issued Nov. 10, 2008 in U.S. Appl. No. 11/410,882.

(Continued)

*Primary Examiner* — Dean Kwak
(74) *Attorney, Agent, or Firm* — Dugan & Dugan, PC

(57) ABSTRACT

A method for abating effluent from an electronic device manufacturing process is provided, including abating the effluent in a thermal abatement tool to form abated effluent; determining whether the abated effluent contains one or more chemical species of interest; and changing one or more operating parameters of the thermal abatement tool based upon the determination. Numerous other embodiments are provided.

12 Claims, 5 Drawing Sheets

(56) References Cited

U.S. PATENT DOCUMENTS

| | | | |
|---|---|---|---|
| 5,264,708 A | 11/1993 | Hijikata | |
| 5,362,458 A | 11/1994 | Saleem et al. | |
| 5,759,237 A | 6/1998 | Li et al. | |
| 5,910,294 A | 6/1999 | Langan et al. | |
| 5,976,222 A | 11/1999 | Yang et al. | |
| 6,068,686 A | 5/2000 | Sorensen et al. | |
| 6,195,621 B1 | 2/2001 | Bottomfield | |
| 6,277,347 B1 | 8/2001 | Stearns et al. | |
| 6,316,045 B1 | 11/2001 | Bernard et al. | |
| 6,419,455 B1 | 7/2002 | Rousseau et al. | |
| 6,468,490 B1* | 10/2002 | Shamouilian et al. | 423/241 |
| 6,491,884 B1 | 12/2002 | Faller et al. | |
| 6,500,487 B1 | 12/2002 | Holst et al. | |
| 6,617,175 B1 | 9/2003 | Arno | |
| 6,905,663 B1 | 6/2005 | Arno | |
| 6,988,017 B2 | 1/2006 | Pasadyn et al. | |
| 7,700,049 B2 | 4/2010 | Clark et al. | |
| 2002/0150527 A1 | 10/2002 | Rossin | |
| 2003/0154044 A1 | 8/2003 | Lundstedt et al. | |
| 2003/0194367 A1 | 10/2003 | Dunwoody et al. | |
| 2004/0001787 A1 | 1/2004 | Porshnev et al. | |
| 2004/0074846 A1 | 4/2004 | Stever et al. | |
| 2004/0121494 A1* | 6/2004 | Arno | 438/7 |
| 2004/0144421 A1 | 7/2004 | Parce et al. | |
| 2004/0213721 A1 | 10/2004 | Arno et al. | |
| 2004/0255848 A1 | 12/2004 | Yudasaka | |
| 2005/0087298 A1 | 4/2005 | Tanaka et al. | |
| 2005/0109207 A1 | 5/2005 | Olander et al. | |
| 2005/0147509 A1 | 7/2005 | Bailey et al. | |
| 2005/0160983 A1 | 7/2005 | Sneh | |
| 2005/0163622 A1 | 7/2005 | Yamamoto et al. | |
| 2005/0177273 A1 | 8/2005 | Miyazaki et al. | |
| 2005/0207961 A1 | 9/2005 | Brooks et al. | |
| 2005/0209827 A1 | 9/2005 | Kitchin et al. | |
| 2005/0233092 A1 | 10/2005 | Choi et al. | |
| 2005/0252884 A1 | 11/2005 | Lam et al. | |
| 2005/0283321 A1 | 12/2005 | Yue et al. | |
| 2006/0104878 A1 | 5/2006 | Chiu | |
| 2006/0104879 A1 | 5/2006 | Chiu et al. | |
| 2006/0111575 A1 | 5/2006 | DeCourcy et al. | |
| 2006/0116531 A1 | 6/2006 | Wonders et al. | |
| 2006/0130649 A1* | 6/2006 | Jain et al. | 95/82 |
| 2006/0175012 A1 | 8/2006 | Lee | |
| 2007/0012402 A1 | 1/2007 | Sneh | |
| 2007/0060738 A1 | 3/2007 | DeBruin | |
| 2007/0079758 A1 | 4/2007 | Holland et al. | |
| 2007/0086931 A1 | 4/2007 | Raoux et al. | |
| 2007/0166205 A1 | 7/2007 | Holst et al. | |
| 2007/0172398 A1 | 7/2007 | Clark | |
| 2007/0217983 A1 | 9/2007 | Stanton et al. | |
| 2007/0256704 A1 | 11/2007 | Porshnev | |
| 2007/0260343 A1 | 11/2007 | Raoux | |
| 2007/0260351 A1 | 11/2007 | Curry | |
| 2008/0003158 A1 | 1/2008 | Raoux et al. | |
| 2008/0072822 A1 | 3/2008 | White | |
| 2008/0087217 A1 | 4/2008 | Yudasaka | |
| 2008/0290041 A1 | 11/2008 | Clark | |
| 2008/0310975 A1 | 12/2008 | Chandler | |
| 2009/0017206 A1 | 1/2009 | Clark | |
| 2009/0018688 A1 | 1/2009 | Chandler | |

FOREIGN PATENT DOCUMENTS

| | | |
|---|---|---|
| JP | 09-273727 | 10/1997 |
| JP | 2004261777 A | 9/2004 |
| WO | WO98/29181 | 7/1998 |
| WO | WO 00/31773 | 6/2000 |
| WO | WO 02/68809 A1 | 2/2002 |
| WO | WO 2005/121912 A1 | 12/2005 |
| WO | WO 2007/109082 A2 | 9/2007 |
| WO | WO 2007/109038 A2 | 9/2008 |
| WO | WO 2007/109081 A2 | 9/2008 |
| WO | WO 2008/147522 A1 | 12/2008 |
| WO | WO 2008/147523 A1 | 12/2008 |
| WO | WO 2008/147524 A1 | 12/2008 |
| WO | WO 2008/156687 A1 | 12/2008 |

OTHER PUBLICATIONS

International Search Report and Written Opinion dated Jul. 15, 2008, relating to International Application No. PCT/US07/06495.

International Search Report and Written Opinion dated Nov. 19, 2008, relating to International Application No. PCT/US08/74937.

International Search Report and Written Opinion dated Nov. 28, 2008, relating to International Application No. PCT/US08/77082.

International Search Report and Written Opinion dated Dec. 29, 2008, relating to International Application No. PCT/US08/81230.

U.S. Appl. No. 12/348,012, filed Jan. 1, 2009.

Mooney et al., "Pump Predictive Diagnostics (online)", Solid State Technology, Jul. 2005, pp. 1-3.

"Conductance Calculations", Dec. 27, 2005, Kurt J. Lesker Company, pp. 1-3.

"Vacuum System Overview: Pressure, Mass-flow and Conductance", Mar. 15, 2004, pp. 1-10.

Fireye CU-20 "Documentation for 45UV5 and 25SU3", May 1994.

U.S. Appl. No. 12/257,888, filed Oct. 24, 2008.

ISR and WO of PCT/US08/81230 dated Dec. 29, 2008.

International Preliminary Report on Patentability and Written Opinion of International Application No. PCT/US2008/081230 mailed May 6, 2010.

Liao, M.Y. et al., "Abatement of perfluorocarbons with an inductively coupled plasma reactor," J. Vac. Sci. Technol. B 17(6) Nov./Dec. 1999, pp. 2638-2643.

Hong et al., "Microwave Plasma Torch Abatement of NF3 and SF6," XXVIIth ICPIG, Eindhoven, the Netherlands, Jul. 18-22, 2005.

Frantzen, M. et al., "Abatement of Perfluorocompounds and Chlorofluorocarbons Using Surface Wave Plasma Technology," A Dissertation, Texas A&M University, Dec. 2005, 148 pages.

Taiwan Search Report of Taiwan Patent Application No. 97141205 dated Nov. 7, 2013.

\* cited by examiner

METHODS AND APPARATUS FOR SMART ABATEMENT USING AN IMPROVED FUEL CIRCUIT

The present application claims priority from U.S. Provisional Patent Application Ser. Nos.:

60/983,143, filed Oct. 26, 2007 and entitled "METHODS AND APPARATUS FOR SMART ABATEMENT USING AN IMPROVED FUEL CIRCUIT", which is hereby incorporated herein by reference in its entirety for all purposes; and 61/020,925, filed Jan. 14, 2008 and entitled "METHODS AND APPARATUS FOR SMART ABATEMENT USING AN IMPROVED FUEL CIRCUIT", which is hereby incorporated herein by reference in its entirety for all purposes

CROSS REFERENCE TO RELATED APPLICATIONS

Co-assigned U.S. patent application Ser. No. 11/673,542, filed Feb. 9, 2007, and entitled "METHODS AND APPARATUS FOR PFC ABATEMENT USING A CDO CHAMBER", is hereby incorporated herein by reference in its entirety for all purposes.

Co-assigned U.S. patent application Ser. No. 10/987,921 filed Nov. 12, 2004 and entitled "REACTOR DESIGN TO REDUCE PARTICLE DEPOSITION DURING PROCESS ABATEMENT", is hereby incorporated herein by reference in its entirety for all purposes.

FIELD OF THE INVENTION

The present invention relates to electronic device manufacturing, and more specifically to an improved fuel circuit and methods and apparatus for using the same for abatement of electronic device manufacturing effluent.

BACKGROUND

Gaseous effluents from electronic material and device manufacturing processes may include a wide variety of chemical compounds which are used and/or produced during such processes. During processing (e.g. deposition, diffusion, etch, clean, epitaxy, etc.), some processes may produce undesirable byproducts including, for example, perfluorocompounds (PFCs) or byproducts that may decompose to form PFCs. PFCs are recognized to be strong contributors to global warming. These compounds, and others which may also be harmful to human beings and/or the environment, may hereinafter be referred to as "harmful chemical species" and may be included in the phrase "chemical species of interest". It is desirable to remove harmful chemical species from the gaseous effluent, or convert harmful chemical species into less harmful or non-harmful chemical species, before the gaseous effluent is vented into the atmosphere.

SUMMARY OF THE INVENTION

In some aspects, a method for abating effluent from an electronic device manufacturing process is provided, which includes abating the effluent in a thermal abatement tool to form abated effluent; determining whether the abated effluent contains one or more chemical species of interest; and changing one or more operating parameters of the thermal abatement tool based upon the determination.

In some aspects, a system for abating effluent from an electronic device manufacturing process is provided, including a thermal abatement tool which is adapted to abate the effluent and to form abated effluent; a sensor which is adapted to determine whether the abated effluent contains one or more chemical species of interest; and a controller which is adapted to receive a signal from the sensor, where the signal indicates whether the abated effluent contains the one or more chemical species of interest; and where the controller is further adapted to change one or more operating parameters of the thermal abatement tool based upon the signal.

In some aspects, a method for increasing the fuel efficiency of an electronic device manufacturing effluent thermal abatement tool is provided, including supplying fuel at a first rate to the thermal abatement tool; abating effluent in the thermal abatement tool to form abated effluent; determining whether the abated effluent contains one or more chemical species of interest; and supplying fuel at a second rate to the thermal abatement tool based upon the determination.

Other features and aspects of the present invention will become more fully apparent from the following detailed description, the appended claims and the accompanying drawings.

DETAILED DESCRIPTION

Figure 1:
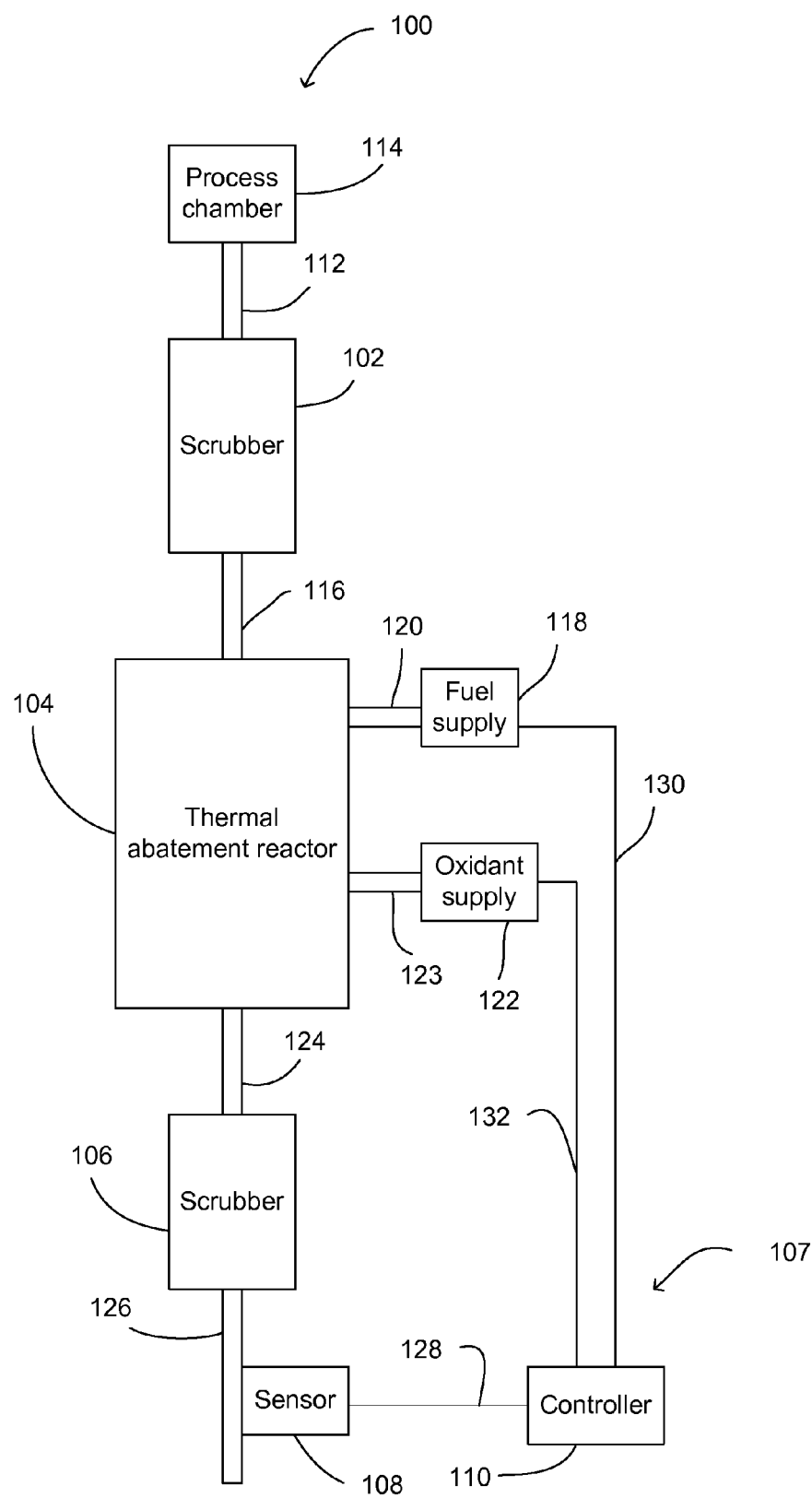
FIG. 1 is a schematic diagram of a system for optimizing a fuel flow rate in accordance with an embodiment of the present invention.

Harmful chemical species may be removed from electronic material and device manufacturing process effluents, or converted into non-harmful, or less harmful, chemical species, by a process known as abatement. During an abatement process, the harmful chemical species used and/or produced by electronic device manufacturing processes may be destroyed or converted to less harmful or non-harmful chemical species (abated) which may be further treated or emitted to the atmosphere. It is common in the industry to refer to "abating effluent" when referring to "abating harmful chemical species in effluent" and "abating effluent" as used herein is intended to include "abating harmful chemical species in effluent".

It is known that effluent may be abated in a thermal abatement reactor which may heat and/or oxidize the effluent, thereby converting the harmful chemical species into less harmful or non-harmful chemical species. The thermal reactor may include a pilot device, a fuel supply, an oxidant supply, burner jets, and effluent inlets. The pilot may be used to ignite burner jets to form burner jet flames. The burner jet flames may generate the high temperatures necessary to abate the effluent.

The amount of heat (which may be measured as the temperature of the thermal reactor) required to abate an effluent may depend upon the nature of the effluent. The nature of the effluent reaching a thermal abatement reactor may vary over time, because a thermal abatement tool may be connected to (and receive a mixture of effluents from) one or more process chambers and/or process tools. The process chambers and process tools may operate independently of each other, and may be running different processes on different schedules. This may result in an effluent mixture having a nature which changes frequently. It may therefore be difficult to predict the nature of an effluent which will enter an abatement tool, or thermal reactor, at any particular time. A result of this unpredictability is that the amount of heat (and therefore fuel) required to abate an effluent mixture that is entering a thermal abatement reactor at any particular time may also be difficult to predict.

One known method of addressing the unpredictability of heat/fuel required to abate a variable effluent mixture is to determine a worst case effluent (e.g., a possible effluent or effluent mixture which may require the most heat/fuel to abate) and use an amount of heat/fuel, which would be sufficient during abatement of the worst case effluent, during abatement of all effluents. While effective, this method may be inefficient, because many effluents, or effluent mixtures, may require lower amounts of heat/fuel for effective abatement.

Accordingly, a need exists for methods and apparatus which provide dynamic optimization of fuel flow and/or oxidant flow in order to reduce any waste of heat/fuel. The amount of fuel supplied to an abatement unit may sometimes be referred to herein as "fuel burn rate" or "fuel rate".

The present invention provides methods and apparatus for dynamic optimization of fuel burn rate in an abatement reaction chamber. As used herein, optimizing the fuel burn rate may mean adjusting the fuel burn rate to reduce the amount of fuel used while continuing to effectively abate an effluent mixture that is entering a thermal reactor at any particular time. Optimizing the fuel burn rate may include steps of increasing the fuel burn rate and reducing the fuel burn rate, as will be described in more detail below.

In some embodiments of the invention, a sensor may be used to determine whether abated effluent (e.g., effluent which has been abated in a thermal abatement reactor) contains a chemical species of interest (e.g., contains more than a threshold concentration of the chemical species of interest). The chemical species of interest may be one or more of a thermally abatable chemical species, fuel and/or oxidant.

In some embodiments of the invention, if the sensor determines that the abated effluent contains a threshold concentration of a thermally abatable chemical species, a controller may increase the flow of fuel and/or oxidant and thereby increase the temperature of the reaction chamber. The controller may continue to increase the temperature until such time as the sensor signals to the controller that the abated effluent does not contain a threshold concentration of the thermally abatable chemical species. A threshold concentration may be zero, "undetectable", or a selected detectable concentration. One skilled in the art will understand how to select a threshold concentration. As used herein, a threshold concentration may be used interchangeably with a threshold amount and/or flow.

In some embodiments, if the sensor determines that the abated effluent contains less than a threshold concentration of a thermally abatable chemical species, the controller may reduce fuel flow to, and therefore the temperature of, the reaction chamber until the sensor detects and reports that the abated effluent contains more than a threshold concentration of the thermally abatable chemical species. When the concentration of thermally abatable chemical species in the abated effluent has risen above the threshold concentration, the controller may then increase the fuel flow to, and the temperature of, the reaction chamber until the sensor reports that the concentration of the thermally abatable chemical species in the abated effluent has fallen below the threshold concentration. This is one method of reducing the amount of fuel used while continuing to effectively abate effluent.

In other embodiments, if the chemical species of interest is fuel and the sensor determines that the abated effluent contains more than a threshold concentration of fuel, the controller may increase oxidant flow rate, or decrease fuel flow rate as appropriate, until the sensor reports to the controller that the concentration of fuel present in the abated effluent has fallen below the threshold concentration.

Turning to FIG. 1, a thermal abatement system 100 of the present invention may include a first scrubber 102 in fluid communication with a thermal reactor 104, which may be in fluid communication with a second scrubber 106. A feedback control system 107 may include at least one sensor 108 which may be positioned at the outflow of the second scrubber 106 and the controller 110. Other locations for the sensor 108 are possible, such as the outflow of the thermal reactor 104. The sensor 108 may be adapted to detect whether the effluent contains one or more chemical species of interest, or the concentration thereof. As described above, the chemical species of interest may be any harmful chemical species, thermally abatable chemical species, fuel, oxidant, or byproducts of incomplete abatement or incomplete fuel combustion, etc. The sensor 108 may provide this information to controller 110 (which may be the system controller) which may be adapted to change abatement process operating parameters, such as, for example, fuel flow, fuel composition, reagent flow, reagent composition, coolant flow, abatement reaction chamber temperature and oxidant flow, or to any other parameter(s) which may be controlled and which may have an effect on the abatement of effluent.

As described above, the abatement system 100 may include first scrubber 102. At least one gaseous effluent stream 112 from one or more process chambers 114 may be directed (e.g., exhausted) into first scrubber 102 which may be adapted to remove $SiF_4$ and other compounds from the effluent stream. It is understood that first scrubber 102 may receive gaseous effluent streams 112 from any number of process tools (not shown) and/or process chambers 114 (e.g., 1, 2, 3, 4, 5, 6, etc.)

First scrubber 102 may employ a water mist to remove or diminish the presence of one or more contaminants (e.g., $SiF_4$) from the gaseous effluent streams. Contaminants or particulates separated from the gaseous effluent stream 112 at first scrubber 102, including $SiF_4$, may be directed into a sump (not shown). The first scrubber 102 is optional.

The effluent from the first scrubber 102 may be directed into the thermal reaction chamber 104 through a conduit 116. In addition to effluent, fuel may be supplied to the reaction chamber from a fuel supply 118 through a conduit 120 and oxidant may be supplied to the reaction chamber 104 from an oxidant supply 122 through conduit 123. Although conduit 120 is shown entering the reaction chamber separately from the effluent being delivered through conduit 116, in some embodiments, fuel may be mixed with effluent in a conduit and introduced to the chamber as a mixture (not shown). In addition, the fuel may be premixed with an amount of oxidant (not shown).

In operation, the fuel and oxidant may mix in the reaction chamber and be ignited to produce a flame. The effluent may be subjected to high temperatures in the presence of oxidant and may burn or oxidize to form an effluent which contains less harmful or non-harmful chemical species. The effluent may be directed from the reaction chamber 104 to the second scrubber 106 through conduit 124.

The second scrubber 106 may employ a packed bed water scrubber to remove or diminish the presence of one or more contaminants (which may have been produced in the reaction chamber) from the gaseous effluent streams. Contaminants or particulates separated from the gaseous effluent stream by the second scrubber 106 may be directed into a sump (not shown). The effluent stream which exits the second scrubber 106 may then be directed through conduit 126 to, for example, a house exhaust (not shown) or a house scrubber (not shown), or vented to the atmosphere. The second scrubber 106 is optional.

The sensor 108 may be positioned and adapted to sample the effluent stream exiting from the second scrubber 106 through conduit 126. The sensor 108 may be further adapted to detect the presence of one or more chemical species of interest, e.g., chemical species of the type which entered the abatement system through conduit 112 and should have been abated in the reaction chamber. Alternatively, the chemical species of interest may be a chemical species which did not enter the thermal reactor through conduit 112, but which were created in the thermal reactor. Such chemical species of interest may be created in the thermal reactor if the thermal reactor is not operated at a sufficiently high temperature. In some embodiments, the sensor 108 may be further adapted to detect the concentration of such chemical species of interest. In yet other embodiments, the sensor 108 may be further adapted to detect one or more of: effluent flow rate; the presence of fuel; the concentration of fuel; the presence of oxidant; and the concentration of oxidant. Fuel and oxidant may be chemical species of interest.

The controller 110 may receive a signal through signal line 128 from the sensor 108 which may indicate one or any combination of 1) the presence or not of one or more abatable chemical species of interest; 2) the concentration of one or more abatable chemical species of interest; 3) the flow rate of the effluent stream; 4) the presence of fuel; 5) the concentration of fuel; 6) the presence of oxidant; and 7) the concentration of oxidant, etc. The signal line 128 may be a wire or a wireless connection, or any other device capable of carrying signals from the sensor 108 to the controller 110. The controller 110 may be adapted to change, or command changes to, abatement process operating parameters in response to the signals it may receive from the sensor 108. For example, the controller 110 may be adapted to effect changes to one, or any combination, of: fuel flow rate; oxidant flow rate; oxidant composition; movable baffles; effluent flow, source and/or flow rate; reagent flow; reagent composition; coolant flow; and abatement reaction chamber temperature, or to any other parameter(s) which may be controlled and which may have an effect on the abatement of effluent. The controller 110 may be connected to the fuel supply 118 through signal line 130 and/or to the oxidant supply 122 through a signal line 132.

Abatement process operating parameters may be changed through the operation of valves (not shown), pumps (not shown) and regulators (not shown), among other things, as is known in the art.

Each process tool (not shown) may include one or more processing chambers 114. The process tools may include, for example, chemical vapor deposition chambers, physical vapor deposition chambers, chemical mechanical polishing chambers, etc. The processes that may be performed in the processing chambers may include, for example, deposition, diffusion, etch, cleaning and epitaxy, etc. The byproduct chemicals to be abated from these processes may include, for example, hydrides of antimony, arsenic, boron, germanium, nitrogen, phosphorous, silicon, selenium, silane, silane mixtures with phosphine, argon, hydrogen, organosilanes, halosilanes, halogens, organometallics and other organic compounds. Among the various components requiring abatement, the halogens, e.g., fluorine ($F_2$) and other fluorinated compounds, may be particularly problematic. The electronics industry may frequently use these fluorinated compounds, referred to as perfluorinated compounds (PFCs), in substrate process tools to remove residue from deposition steps and to etch thin films. Examples of some of the most commonly used PFCs include $CF_4$, $C_2F_6$, $SF_6$, $C_3F_8$, $NF_3$, $CHF_3$, $CH_3F$, and $CH_2F_2$.

As stated above, the first scrubber 102 may be adapted to use a water mist to remove contaminants from the gaseous effluent stream(s) output by the process chamber(s) 114. For example, a plurality of high pressure nozzles may be used to create a mist within the first scrubber 106. Any suitable wet scrubbers can be used. Exemplary scrubbers are described in co-owned U.S. patent application Ser. No. 11/673,542, filed Feb. 9, 2007, and entitled "METHODS AND APPARATUS FOR PFC ABATEMENT USING A CDO CHAMBER".

The present invention may be used with any suitable thermal reaction chamber, such as, for example, the thermal reaction chamber disclosed in co-assigned U.S. patent application Ser. No. 10/987,921 filed Nov. 12, 2004 and entitled "REACTOR DESIGN TO REDUCE PARTICLE DEPOSITION DURING PROCESS ABATEMENT". In addition to fuel fired thermal abatement chambers, the present invention may be used with electrically heated and/or plasma abatement chambers. In the case of electrically heated and plasma abatement chambers, the controller may change the amount of energy being used to abate effluent rather than changing the amount of fuel used to abate the effluent.

In some embodiments, the walls of the reaction chamber may be made from a porous material, (e.g., ceramic) which may allow, for example, an oxidant (e.g., clean dry air, oxygen) to diffuse or flow into the reaction chamber. Alternatively, the oxidant may be flowed into the reaction chamber by other means. A fuel source may supply fuel(s) (e.g., natural gas, methane, hydrogen) to the reaction chamber. In some embodiments, the abatement system 100 may include more than one fuel source or a mix of fuels from a single source, whereby the multiple fuel sources may provide different fuels, or combinations of fuels, which may be more effective at abating different effluents. A pilot light (not shown), for example, or other ignition means, may be used to ignite the fuel and oxidant mixture in the reaction chamber, which may create the temperatures in the reaction chamber necessary to abate the effluent, as is known in the art.

The sensor 108 may include electrochemical cells, optical sensors, such as thermopile and FTIR sensors, or mass spectroscopes, etc. Any suitable sensors adapted to sense the presence and/or concentration of one or more of fuel, oxidant, thermally abatable chemical species, byproducts of incomplete combustion, and any other chemical species of interest.

The controller 110 may be a microcomputer, microprocessor, logic circuit, a combination of hardware and software, or the like. The controller 110 may be dedicated to the feedback control system 107 or may also perform as the system controller for the abatement unit.

The controller 110 may also be coupled to one or more pumps, valves, and/or regulators (not shown) which may be coupled to inlets (not shown) at the processing chambers 114 of the process tool, to the fuel source, to the oxidant supply and to the reaction chamber end of the conduits 112 that couple the one or more process tools to the one or more abatement system 100. These pumps, valves and/or regulators may enable the controller 110 to manipulate and alter the various flows of effluent, fuel and/or oxidant. Based on a signal sent from the sensor 108, for example, the controller 110 may selectively manipulate the process tools, the fuel source 118 and the reaction chamber 104, through operation of the valves, pumps and/or regulators to allow/halt/limit/reduce or increase the various flows, to modify abatement unit operating parameters as will be further described in the examples provided below. The controller 110 may be hardwired or wirelessly coupled to the valves, pumps and/or regulators. In some embodiments, the controller 110 may also be coupled to and/or otherwise communicate with and/or control operation of process tools and abatement system 100, as further described below.

In operation, effluent streams from one or more electronic device process chambers may be directed into first scrubber 102 through conduits 112. First scrubber 102 may remove particulate materials and water soluble compounds from the effluent stream.

From first scrubber 102, the effluent stream may be directed through conduit 116 into the thermal reactor 104 in which fuel and oxidant may be ignited to produce burner flames which may generate high temperatures on the order of about 500° C. to about 2000° C. Harmful chemical species contained in the effluent stream may be oxidized in the thermal reactor 104 to form less harmful or non-harmful chemical species. Some or all of these less harmful or non-harmful chemical species may be water soluble.

The effluent stream may be directed from the thermal reactor 104 through conduit 124 to the second scrubber 106, where particulates and water soluble compounds may be removed from the effluent stream. The abated effluent exhausted from the second scrubber 106 may then be tested with the sensor 108.

In some embodiments, the sensor may be adapted to detect the presence and/or concentration of one or more harmful chemical species which are thermally abatable. Harmful chemical species which are thermally abatable may be one form of chemical species of interest. If the concentration of one or more thermally abatable chemical species is determined to be above a threshold concentration, the sensor 108 may send a signal indicating such condition to the controller 110. Upon receiving the signal, the controller 110 may command process parameter changes which may increase the temperature in the thermal reactor 104. In some embodiments the controller 110 may cause incremental thermal reactor temperature increases until such time as the sensor 108 reports that the concentration of one or more thermally abatable chemical species has fallen below the threshold concentration. Such process parameter changes may include increasing the amount of fuel and or oxidant flow to the thermal reaction chamber.

In some embodiments, the sensors may be adapted to detect the presence of one or more harmful chemical species which may be thermally abatable. If thermally abatable compounds are not detected in the effluent stream, or are detected at a concentration below a threshold concentration, the sensor 108 may send a signal indicating such condition to the controller 110. This condition may indicate that too much fuel is being used in the thermal reactor 104. Upon receiving such an indication, the controller 110 may command process parameter changes which may decrease the temperature in the thermal reactor 104. Such process parameter changes may include decreasing the amount of fuel and or oxidant flow to the thermal reaction. The controller 110 may continue to command incremental temperature decreases in the thermal reactor 104 until such time as the sensor 108 reports that the concentration of thermally abatable compounds in the effluent from the second scrubber 106 has risen above a threshold concentration.

In another embodiment, the sensor 108 may alternatively or additionally be used to determine whether more fuel is being flowed to the burner jets than may be needed to fully abate the effluent. For example, if the controller 110 determines that the effluent composition contains no harmful or thermally abatable chemical species, the controller 110 may send a signal to the valves to decrease the fuel flow rate into the burner jets by a pre-determined amount, thereby lowering the temperature in the reaction chamber. If the controller 110 then receives a signal from the sensor 108 indicating that the effluent composition still contains no harmful chemical species, the controller 110 may send a signal to the valves to decrease the fuel flow rate into the burner jets by a pre-set amount. The cycle of incrementally decreasing the fuel flow rate into the burner jets may continue, for example, until a harmful compound is detected. In this manner, the fuel flow rate would also be optimized by not supplying more fuel to the burner jets, and hence reaction chamber, than may be necessary. In another embodiment, if the incremental decrease of fuel results in the detection of a harmful compound in the effluent, the controller may command an increase in fuel flow until the harmful compound is no longer detected.

In the same or other embodiments, the sensor 108 may be adapted to detect the presence of fuel in the effluent from the second scrubber 106. If any fuel, or more than a predetermined amount or concentration of fuel, is detected in the effluent stream, the sensor 108 may send a signal indicating such condition to the controller 110. Upon receiving such a signal, the controller 110 may command process parameter changes which may increase the efficiency of fuel oxidation in the thermal reactor 104. The process parameter changes may include, for example, increasing the flow of oxidant, or decreasing the flow of fuel, into the thermal reactor 104. Such process parameter changes may continue to be commanded by the controller 110 until such time as the sensor 108 reports that the concentration of fuel in the effluent from the second scrubber 106 has fallen below the threshold concentration.

In yet another embodiment, the sensors may be adapted to detect the presence of oxidant in the effluent which is exhausted from the second scrubber 106. If more than a threshold concentration of oxidant is detected in the effluent stream, the sensor 108 may send a signal indicating such condition to the controller 110. Upon receiving such a signal, the controller 110 may command process parameter changes which may increase the efficiency of oxidant usage in the thermal reactor 104, such as, for example, increasing the flow of fuel, or decreasing the flow of oxidant, into the thermal reactor 104. Such process parameter changes may continue to be commanded by the controller 110 until such time as the sensor 108 reports that the amount or concentration of oxidant in the effluent from the second scrubber 106 has fallen below the threshold concentration.

In yet another embodiment, as the effluent leaves the second scrubber 106, it may flow past the sensor 108 positioned downstream of the second scrubber 106 (e.g., in conduit 126). The sensor 108 may test the effluent and may send a signal indicative of the effluent composition to the controller 110. The controller 110 may then determine whether the effluent has been abated to a predefined level. If the controller 110 determines that the effluent has been abated to the predefined level, the fuel flow rate may be maintained for the effluent being abated in the reaction chamber. If the controller 110 determines that the effluent has not been sufficiently abated, the controller 110 may send a signal to the valves to open further such that the valves may increase the fuel flow rate into the burner jets (not shown), thereby enabling the mixture of additional fuel with the oxidant and additional fuel ignition, which in turn may generate the higher temperatures necessary to abate more of the effluent.

In some embodiments, the controller 110 may make standardized pre-selected incremental adjustments to process parameters based on detection of a harmful compound, fuel, oxidant, etc. In some other embodiments, the controller 110 may make non-standardized incremental process parameter adjustments based upon the concentration of harmful chemical species, fuel and/or oxidant.

In still other embodiments, the controller 110 may make a determination that the range of process control available through effecting changes in fuel and/or oxidant flow rates may be insufficient, and may instead change the effluent input to the abatement system.

Figure 2:
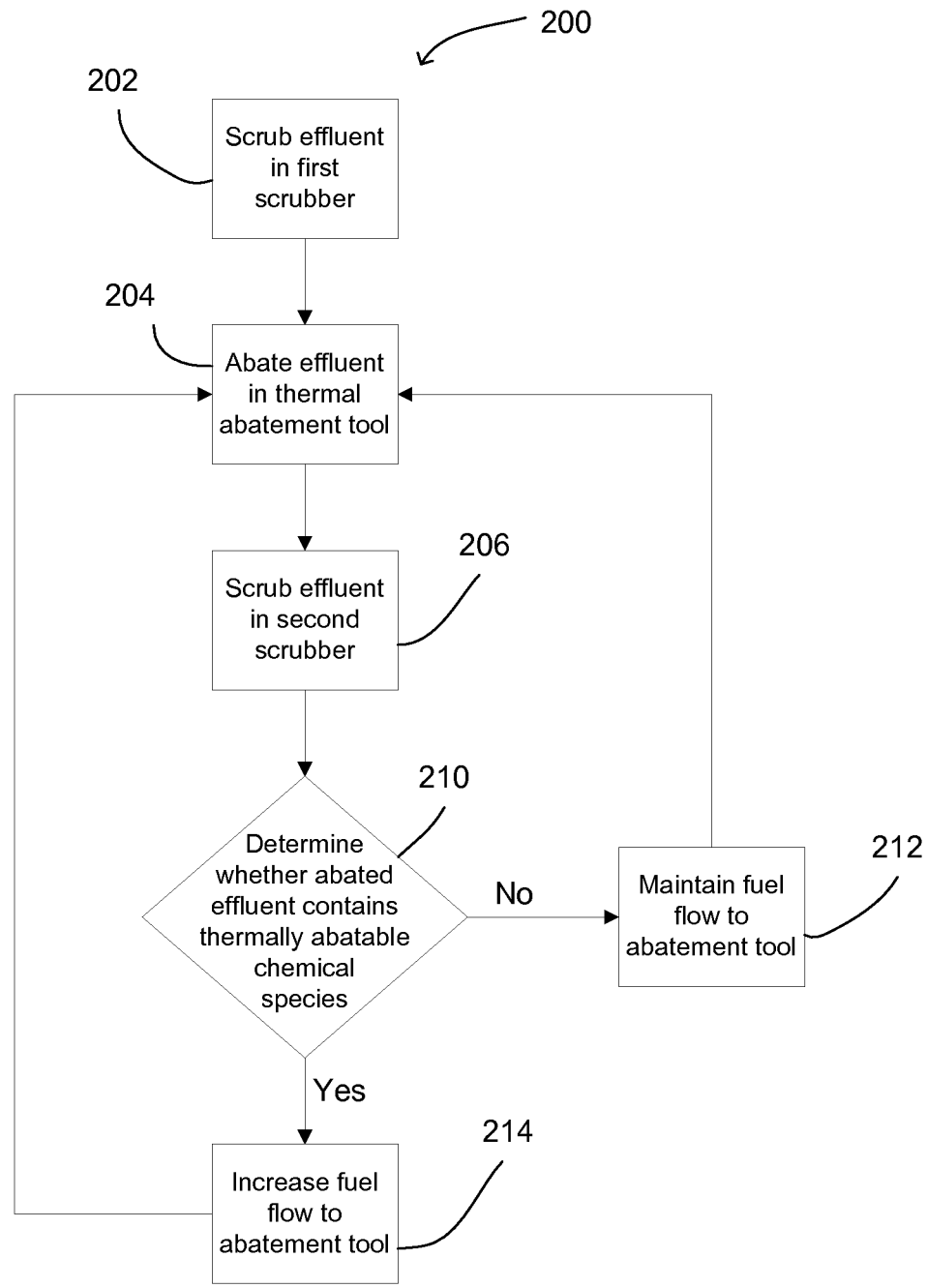
FIG. 2 is a flowchart illustrating an exemplary method for optimizing a fuel flow rate in accordance with an embodiment of the present invention.

FIG. 2 is a flowchart illustrating an exemplary method 200 for optimizing a fuel burn rate of the present invention. In optional step 202 an effluent stream is scrubbed in a first scrubber. In step 204, the effluent is abated in a thermal reaction chamber. Steps 202 and 204 may be performed in any order. Following the abatement of the effluent in the thermal reaction chamber in step 204, the oxidized effluent is scrubbed in optional step 206 in a second scrubber. The presence of one or more thermally abatable chemical species is determined in step 210. If it is determined in step 210 that the effluent stream does not contain thermally abatable chemical species, then fuel flow to the thermal reactor is maintained in step 212. The method loops from step 212 to step 204 where effluent is abated in a thermal abatement tool, and proceeds as described above. If it is determined in step 210 that the effluent stream does contain thermally abatable compounds, then the fuel flow to the thermal reactor is increased in step 214. The increase in fuel flow may typically increase the temperature of the thermal reactor. The increase in fuel flow to the thermal reactor in step 214, may be an incremental increase of a predetermined magnitude. The increase in fuel flow may also be an amount that is determined by the controller in response to the concentration of the one or more thermally abatable chemical species. Following the increase of the fuel flow to the thermal reactor in step 214, the method loops to step 204 where effluent is abated in a thermal abatement tool, and proceeds as described above. The method 200 may be applied continuously during operation of the electronic device manufacturing system.

Figure 3:
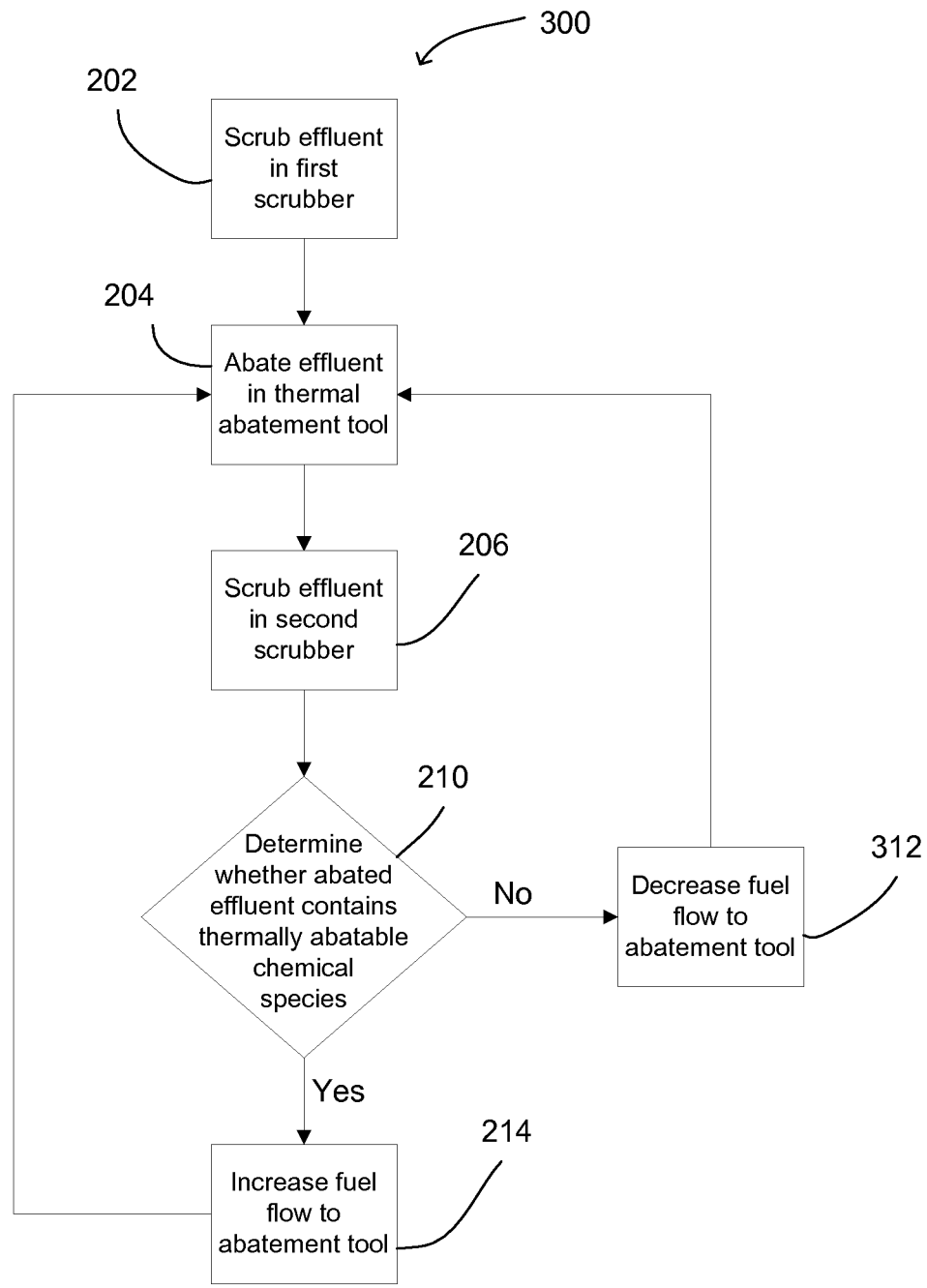
FIG. 3 is a flowchart illustrating an exemplary method for optimizing a fuel flow rate in accordance with another embodiment of the present invention.

FIG. 3 is a flowchart illustrating another exemplary method 300 for optimizing a fuel burn rate or efficiency of the present invention. Method 300 is similar to method 200 with the exception of step 312, which replaces step 212, and only this different step will be described. In step 312 (to which the method 300 proceeds if it is determined in step 210 that thermally abatable chemical species do not exist in the effluent stream), the fuel flow to the reactor is decreased by an incremental amount, rather than maintained as in step 212. The method 300 then proceeds to step 204, where effluent is abated in a thermal abatement tool, and proceeds as described above with respect to FIG. 2.

Figure 4:
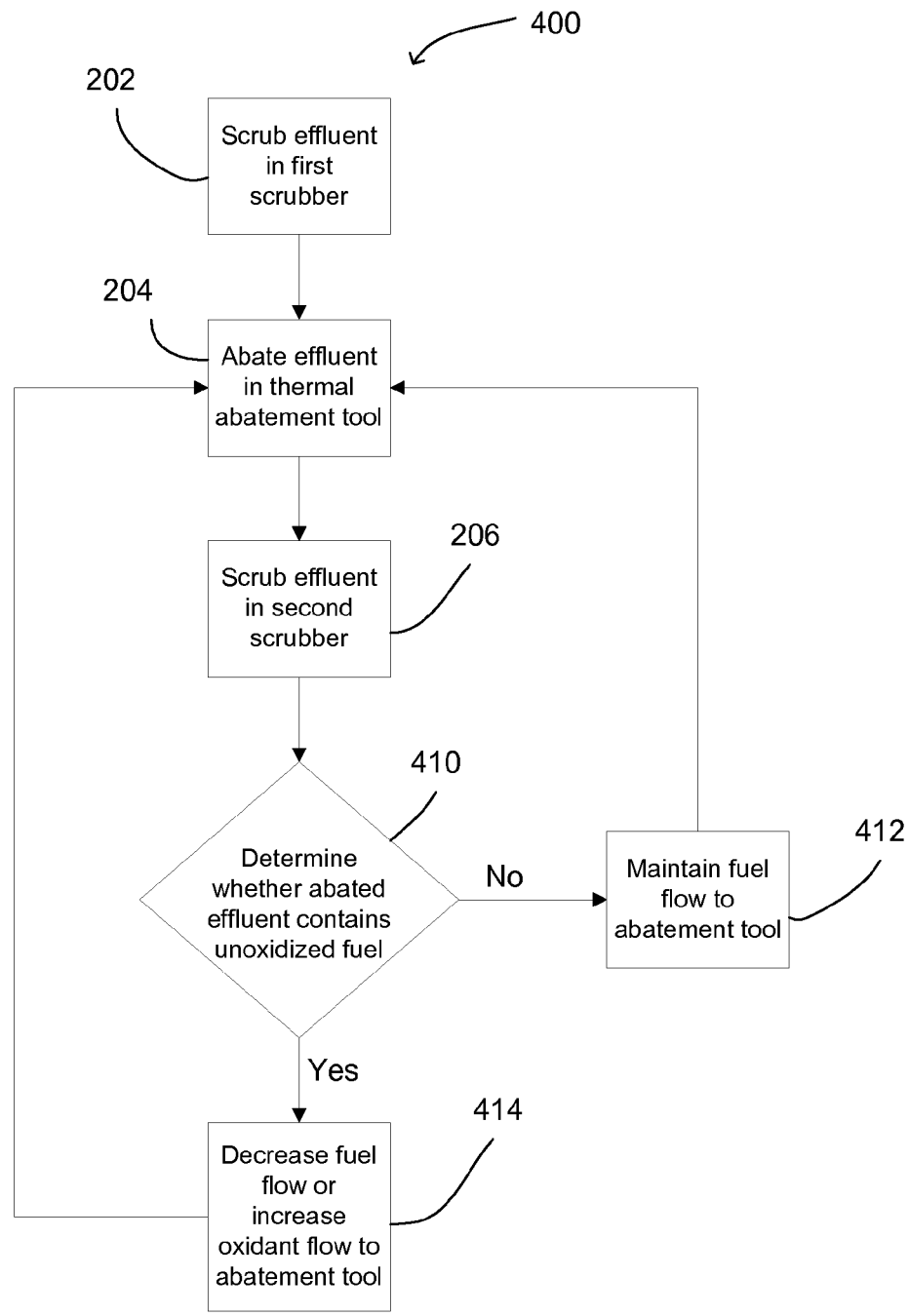
FIG. 4 is a flowchart illustrating an exemplary method for optimizing a fuel flow rate in accordance with yet another embodiment of the present invention.

FIG. 4 is a flowchart illustrating another exemplary method 400 for optimizing a fuel burn rate of the present invention. Method 400 is similar to method 200 with the exception of steps 410, 412 and 414, which replace analogous steps 210, 212 and 214, respectively. The method 400 will be described only with respect to the different steps. Thus, in step 410, instead of determining whether the effluent stream contains unabated effluent, the method 400 determines whether the effluent stream contains unoxidized fuel. The presence of unoxidized fuel in the abated effluent may be an indication that too much fuel is being supplied to the thermal reactor or that insufficient oxidant is being supplied to the reactor. If it is determined that the effluent contains unoxidized fuel, the method proceeds to step 414, where the fuel flow to the thermal reactor is decreased (e.g., by a predetermined increment) or the oxidant flow to the thermal reactor is increased (e.g., by a predetermined increment). Following step 414, the method 400 loops to step 204, which is described above with respect to FIG. 2.

If it is determined that the effluent stream does not contain unoxidized fuel in step 410, the absence of unburned fuel in the abated effluent may indicate that a sufficient amount of fuel is being provided to the thermal reactor. In some embodiments, the method 400 proceeds to step 412, where the fuel flow is maintained. Following step 412, the method 400 loops to step 204, which is described above with respect to FIG. 2.

The absence of unburned fuel in the abated effluent may also indicate that an insufficient amount of fuel is being provided to the thermal reactor. In some embodiments, therefore, the fuel flow may be increased in step 412, rather than simply maintained. From step 412, the method 400 loops to step 204, as described above.

Figure 5:
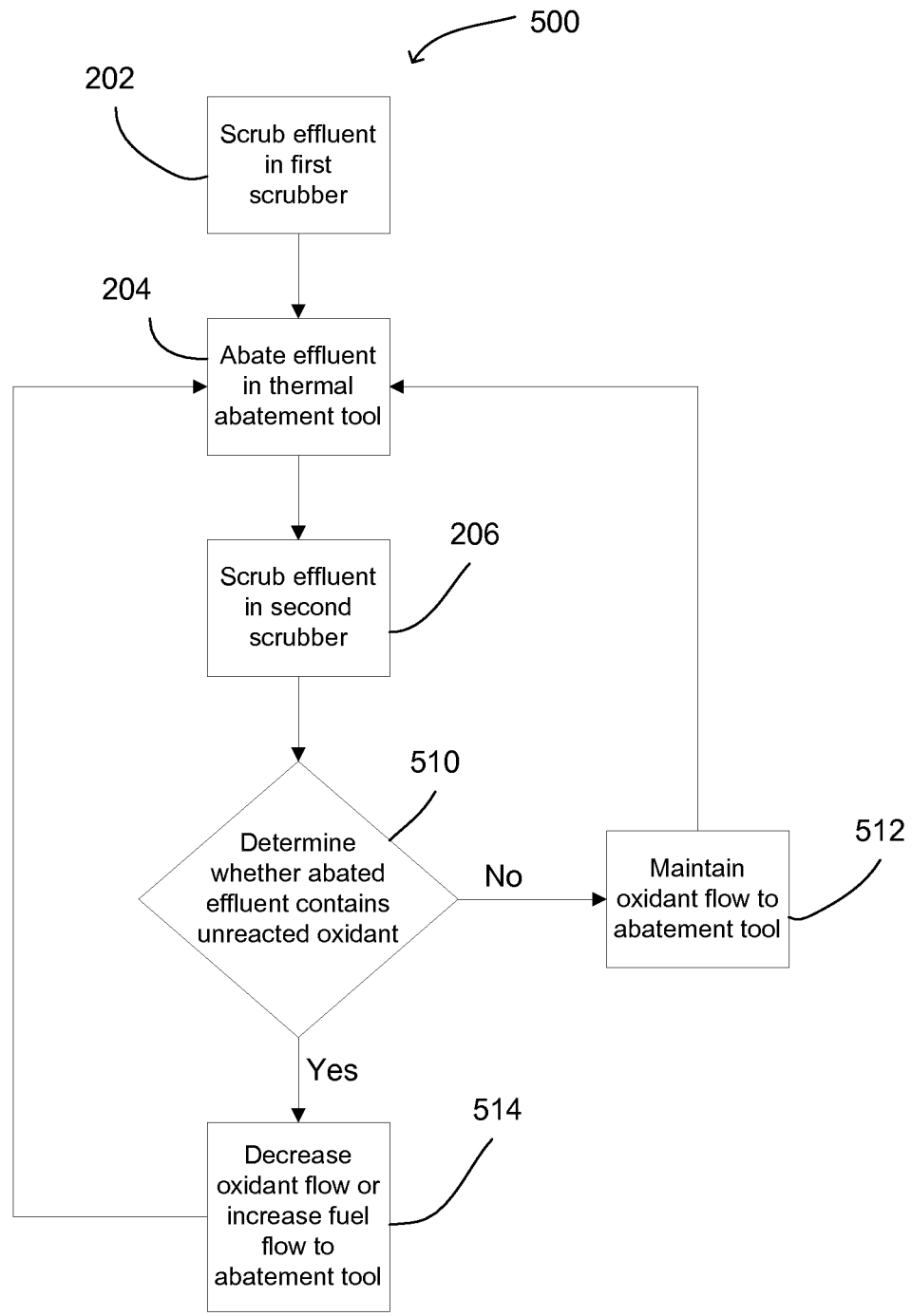
FIG. 5 is a flowchart illustrating an exemplary method for optimizing an oxidant flow rate in accordance with still another embodiment of the present invention.

FIG. 5 is a flowchart illustrating an exemplary method 500 for optimizing an oxidant flow rate of the present invention. Method 500 is similar to method 400 with the exception of steps 510, 512 and 514, which replace analogous steps 410 and, 412 and 414, respectively. The method 500 will be described only with respect to the different steps. Thus, instead of determining whether the effluent stream contains an oxidized fuel, in step 510, the method 500 determines whether the effluent stream contains unreacted oxidant. The presence of unreacted oxidant in the abated effluent may be an indication that too much oxidant is being supplied to the thermal reactor or that insufficient fuel is being supplied to the reactor. If it is determined that the effluent contains unreacted oxidant, the method proceeds to step 514, where the oxidant flow to the thermal reactor is decreased (e.g., by a predetermined increment) or the fuel flow to the thermal reactor is increased (e.g., by a predetermined increment). Following step 514, the method 500 loops to step 204, which is described above with respect to FIG. 2, and proceeds from there as described above.

The absence of unreacted oxidant in the abated effluent may indicate that a sufficient amount of oxidant is being supplied to the thermal reaction chamber. In some embodiments, if it is determined in step 510 that the effluent stream does not contain unreacted oxidant, the method 500 proceeds to step 512, where the oxidant flow is maintained. From step 512, the method 500 loops to step 204, which is described above with respect to FIG. 2.

The absence of unreacted oxidant in the abated effluent may also indicate that an insufficient amount of oxidant is being provided to the thermal reactor. In some embodiments, therefore, the oxidant flow may be increased in step 512, rather than simply maintained. From step 512, the method 500 loops to step 204, as described above.

Accordingly, while the present invention has been disclosed in connection with exemplary embodiments thereof, it should be understood that other embodiments may fall within the spirit and scope of the invention, as defined by the following claims.

The invention claimed is:

1. A system for abating effluent from an electronic device manufacturing process comprising:
   a thermal abatement tool, including a thermal abatement reactor, configured to abate the effluent and to form abated effluent;
   a fuel supply coupled to the thermal abatement reactor and configured to supply a fuel thereto;
   an oxidant supply coupled to the thermal abatement reactor and configured to provide a controllable supply of an oxidant thereto;
   a sensor configured to determine whether the abated effluent contains one or more chemical species of interest; and
   a controller configured to receive a signal from the sensor and coupled to at least one pump, valve, or regulator for controlling at least one of the fuel supply, the oxidant supply, and at least one inlet to the thermal abatement reactor; wherein:
   the signal indicates whether the abated effluent contains the one or more chemical species of interest; and
   the controller is further configured to change one or more operating parameters of the thermal abatement tool through operation of the at least one pump, valve, or regulator based upon the signal, wherein the one or more operating parameters comprise at least one of fuel flow, fuel composition, reagent flow, reagent composition, coolant flow, oxidant flow, and abatement reaction temperature.

2. The system of claim 1 wherein the sensor is further configured to determine a concentration of the one or more chemical species of interest.

3. The system of claim 1 wherein the chemical species of interest include one or more of harmful chemical species, thermally abatable chemical species, fuel and oxidant.

4. The system of claim 1 wherein the sensor comprises one or more electrochemical cells, optical sensors, thermopiles, Fourier Transform Infrared (FTIR) sensors, or mass spectroscopes.

5. The system of claim 1 wherein the controller comprises a microcomputer, a microprocessor, a logic circuit, or a combination of hardware and software.

6. The system of claim 1 wherein the controller is configured to decrease the amount of fuel or oxidant flow to the thermal abatement reactor through operation of the one or more pumps, valves, or regulators based upon a signal received from the sensor indicating a concentration below a threshold concentration.

7. The system of claim 1 wherein the controller configured to to decrease the amount of fuel or increase oxidant flow to the thermal abatement reactor through operation of the one or more pumps, valves, or regulators based upon a signal received from the sensor indicating a presence of fuel in the abated effluent.

8. A system for abating effluent from an electronic device manufacturing process comprising:
   a thermal abatement tool, including a thermal abatement reactor, configured to abate an effluent and to form abated effluent;
   a sensor configured to determine whether the abated effluent contains one or more chemical species of interest; and
   a controller configured to receive a signal from the sensor and coupled to at least one pump, valve, or supply of electrical energy for controlling operation of the thermal abatement tool; wherein:
   the signal indicates whether the abated effluent contains the one or more chemical species of interest; and
   the controller is further configured to change one or more operating parameters of the thermal abatement tool through operation of the at least one pump, valve, or supply of electrical energy based upon the signal, wherein the one or more operating parameters comprise at least one of fuel flow, fuel composition, reagent flow, reagent composition, coolant flow, oxidant flow, an amount of electrical energy, and abatement reaction temperature.

9. The system of claim 8 wherein the thermal abatement reactor comprises a fuel-fired abatement chamber, an electrically-heated abatement chamber, or a plasma abatement chamber.

10. The system of claim 8 wherein the thermal abatement reactor comprises an electrically-heated abatement chamber or a plasma abatement chamber and the controller configured to change an amount of electrical energy provided to the thermal abatement reactor by the source of electrical energy based upon the signal.

11. The system of claim 8 wherein the sensor comprises one or more electrochemical cells, optical sensors, thermopiles, Fourier Transform Infrared (FTIR) sensors, or mass spectroscopes.

12. The system of claim 8 wherein the controller comprises a microcomputer, a microprocessor, a logic circuit, or a combination of hardware and software.

* * * * *